(12) United States Patent
Kealy et al.

(10) Patent No.: US 7,603,499 B2
(45) Date of Patent: *Oct. 13, 2009

(54) METHOD FOR USING A MEMORY DEVICE WITH A BUILT-IN MEMORY ARRAY AND A CONNECTOR FOR A REMOVABLE MEMORY DEVICE

(75) Inventors: Kevin P. Kealy, Scotland (GB); Maria A. Sabatini, Scotland (GB)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/731,523

(22) Filed: Mar. 30, 2007

(65) Prior Publication Data

US 2008/0244113 A1    Oct. 2, 2008

(51) Int. Cl.
*G06F 13/10*    (2006.01)
(52) U.S. Cl. .............................. 710/74; 710/14; 710/38
(58) Field of Classification Search ........................ None
See application file for complete search history.

(56) References Cited

U.S. PATENT DOCUMENTS

| | | | |
|---|---|---|---|
| 5,218,685 | A | 6/1993 | Jones |
| 5,887,145 | A | 3/1999 | Harari et al. |
| 6,070,226 | A | 5/2000 | Freeman et al. |
| 6,075,706 | A | 6/2000 | Learmonth et al. |
| 6,226,202 | B1 | 5/2001 | Kikuchi et al. |
| 6,523,132 | B1 | 2/2003 | Harari et al. |
| 6,545,891 | B1 | 4/2003 | Tringali et al. |
| 6,584,541 | B2 | 6/2003 | Friedman et al. |
| 6,612,498 | B1 | 9/2003 | Lipponen et al. |
| 6,711,043 | B2 | 3/2004 | Friedman et al. |
| 6,765,813 | B2 | 7/2004 | Scheuerlein et al. |

(Continued)

FOREIGN PATENT DOCUMENTS

EP    0 273 665    7/1988

(Continued)

OTHER PUBLICATIONS

International Search Report and Written Opinion for PCT/US2008/003112, dated Jun. 4, 2008, 10 pages.

(Continued)

*Primary Examiner*—Ilwoo Park
(74) *Attorney, Agent, or Firm*—Brinks Hofer Gilson & Lione

(57) ABSTRACT

A method for using a memory device with a built-in memory array and a connector for a removable memory device is disclosed. In one embodiment, a determination is made regarding whether a removable memory device comprises a memory controller. If the removable memory device does not comprise a memory controller, circuitry in a memory device connected to the removable memory device is used to control read/write operations to a memory array in the removable memory device. In another embodiment, data stored in a built-in memory of a memory device is read, and the read data is stored in a memory array of a removable memory device. In yet another embodiment, a connection of a removable memory device to a memory device is detected. Pre-loaded content is read from a memory array in the removable memory device and stored in the built-in memory array of the memory device.

17 Claims, 7 Drawing Sheets

U.S. PATENT DOCUMENTS

| | | | |
|---|---|---|---|
| 6,768,661 | B2 | 7/2004 | Vyvoda et al. |
| 6,824,063 | B1 | 11/2004 | Wallace et al. |
| 6,839,262 | B2 | 1/2005 | Vyvoda et al. |
| 6,996,660 | B1 | 2/2006 | Moore et al. |
| 7,003,619 | B1 | 2/2006 | Moore et al. |
| 7,062,602 | B1 | 6/2006 | Moore et al. |
| 7,114,659 | B2 | 10/2006 | Harari et al. |
| 7,136,883 | B2 | 11/2006 | Flamma et al. |
| 7,162,549 | B2* | 1/2007 | Mambakkam et al. ........ 710/16 |
| 7,441,096 | B2 | 10/2008 | Kitamura |
| 2002/0085404 | A1 | 7/2002 | Lu et al. |
| 2002/0184459 | A1* | 12/2002 | Taussig et al. .............. 711/165 |
| 2003/0095484 | A1 | 5/2003 | Motohashi |
| 2003/0145141 | A1 | 7/2003 | Chen et al. |
| 2006/0047920 | A1* | 3/2006 | Moore et al. ................ 711/154 |
| 2008/0244203 | A1 | 10/2008 | Gorobets et al. |

FOREIGN PATENT DOCUMENTS

| | | |
|---|---|---|
| EP | 0 757 317 | 2/1997 |
| EP | 1 327 957 A1 | 7/2003 |
| EP | 1 462 927 | 9/2004 |
| GB | 2374204 | 10/2002 |
| WO | WO 2008/042068 A | 4/2008 |

OTHER PUBLICATIONS

International Search Report and Written Opinion for PCT/US2008/002615, dated Aug. 13, 2008, 9 pages.

The International Search Report and the Written Opinion for PCT/US2007/019365 dated Apr. 2, 2008, 10 pages.

U.S. Appl. No. 09/877,691; "Method For Re-Directing Data Traffic In A Write-Once Memory Device;" inventors: J. James Tringali, Christopher S. Moore, Roger W. March, James E. Schneider, Derek J. Bosch, And Daniel C. Steere; filed Jun. 8, 2001.

U.S. Appl. No. 11/496,985; "Multi-Use Memory Cell and Memory Array;" inventors: Roy Scheuelein and Tanmay Kumar; filed Jul. 31, 2006.

U.S. Appl. No. 11/496,984; "Method for Using a Multi-Use Memory Cell and Memory Array;" inventors: Roy Scheuelein and Tanmay Kumar; filed Jul. 31, 2006.

U.S. Appl. No. 11/496,874; "Mixed-Use Memory Array;" inventors: Roy Scheuelein; filed Jul. 31, 2006.

U.S. Appl. No. 11/496,983; "Method for Using a Mixed-Use Memory Array;" inventors: Roy Scheuelein; filed Jul. 31, 2006.

U.S. Appl. No. 11/496,870; "Mixed-Use Memory Array with Different Data States;" inventors: Roy Scheuelein and Christopher Petti; filed Jul. 31, 2006.

U.S. Appl. No. 11/497,021; "Method for Using a Mixed-Use Memory Array with Different Data States;" inventors: Roy Scheuelein and Christopher Petti; filed Jul. 31, 2006.

U.S. Appl. No. 11/529,555; "Apparatus Combining Once-Writable and Rewritable Information Storage to Support Data Processing;" inventors: Neil Dunlop and Kevin Kealy; filed Sep. 29, 2006.

U.S. Appl. No. 11/529,582; "Method Combining Once-Writable and Rewritable Information Storage to Support Data Processing;" inventors: Neil Dunlop and Kevin Kealy; filed Sep. 29, 2006.

"SanDisk microSD™ Cards," 1 page, 2007.

"SanDisk Sansa® Connect™ MP3 Player," 1 page, 2007.

Office Action for U.S. Appl. No. 11/529,582, dated Dec. 19, 2008, 8 pages.

Office Action for U.S. Appl. No. 11/731,511, dated Mar. 17, 2009, 14 pages.

Office Action for U.S. Appl. No. 11/529,555, dated May 6, 2009, 10 pages.

Office Action for U.S. Appl. No. 11/731,531, dated Oct. 29, 2008, 11 pages.

\* cited by examiner

METHOD FOR USING A MEMORY DEVICE WITH A BUILT-IN MEMORY ARRAY AND A CONNECTOR FOR A REMOVABLE MEMORY DEVICE

CROSS-REFERENCE TO RELATED APPLICATION

This application is related to "Memory Device with a Built-In Memory Array and a Connector for a Removable Memory Device," U.S. patent application Ser. No. 11/731,511, filed herewith, which is hereby incorporated by reference.

BACKGROUND

Some "hybrid" memory devices comprise both a rewritable memory array and a one-time programmable memory array. While there are certain advantages to having both types of memory arrays in a single memory device, the usability of such a memory device may become limited after the one-time programmable memory has been completely written to. That is, because one-time programmable memory cells cannot be re-programmed, eventually, the one-time programmable memory array will lose all of its programming capability and effectively become a read-only memory array. As such, only the rewritable memory array of the memory device would be available for write operations. This reduces the value of the memory device to the end user.

SUMMARY

The present invention is defined by the claims, and nothing in this section should be taken as a limitation on those claims.

By way of introduction, the embodiments described below provide a method for using a memory device with a built-in memory array and a connector for a removable memory device. In one embodiment, a determination is made regarding whether a removable memory device connected to a first connector of a memory device comprises a memory controller, wherein the memory device comprises a second connector configured to connect to a host device and also comprises a built-in memory array. If it is determined that the removable memory device does not comprise a memory controller, circuitry in the memory device is used to control read/write operations to a memory array in the removable memory device. If it is determined that the removable memory device does comprise a memory controller, the memory controller is used to control read/write operations to the memory array in the removable memory device. In another embodiment, data stored in a built-in memory of a memory device is read, wherein the memory device comprises a first connector configured to connect to a removable memory device and a second connector configured to connect to a host device. The data is then stored in a memory array of a removable memory device connected to the first connector. In yet another embodiment, a connection of a removable memory device to a first connector of a memory device is detected, wherein the memory device comprises a second connector configured to connect to a host device and also comprises a built-in memory array, and wherein the removable memory device comprises a memory array storing pre-loaded content. The pre-loaded content is read from the memory array in the removable memory device, and the read pre-loaded content is stored in the built-in memory array of the memory device. Other embodiments are disclosed, and each of the embodiments can be used alone or together in combination.

The embodiments will now be described with reference to the attached drawings.

DETAILED DESCRIPTION OF THE PRESENTLY PREFERRED EMBODIMENTS

Figure 1:
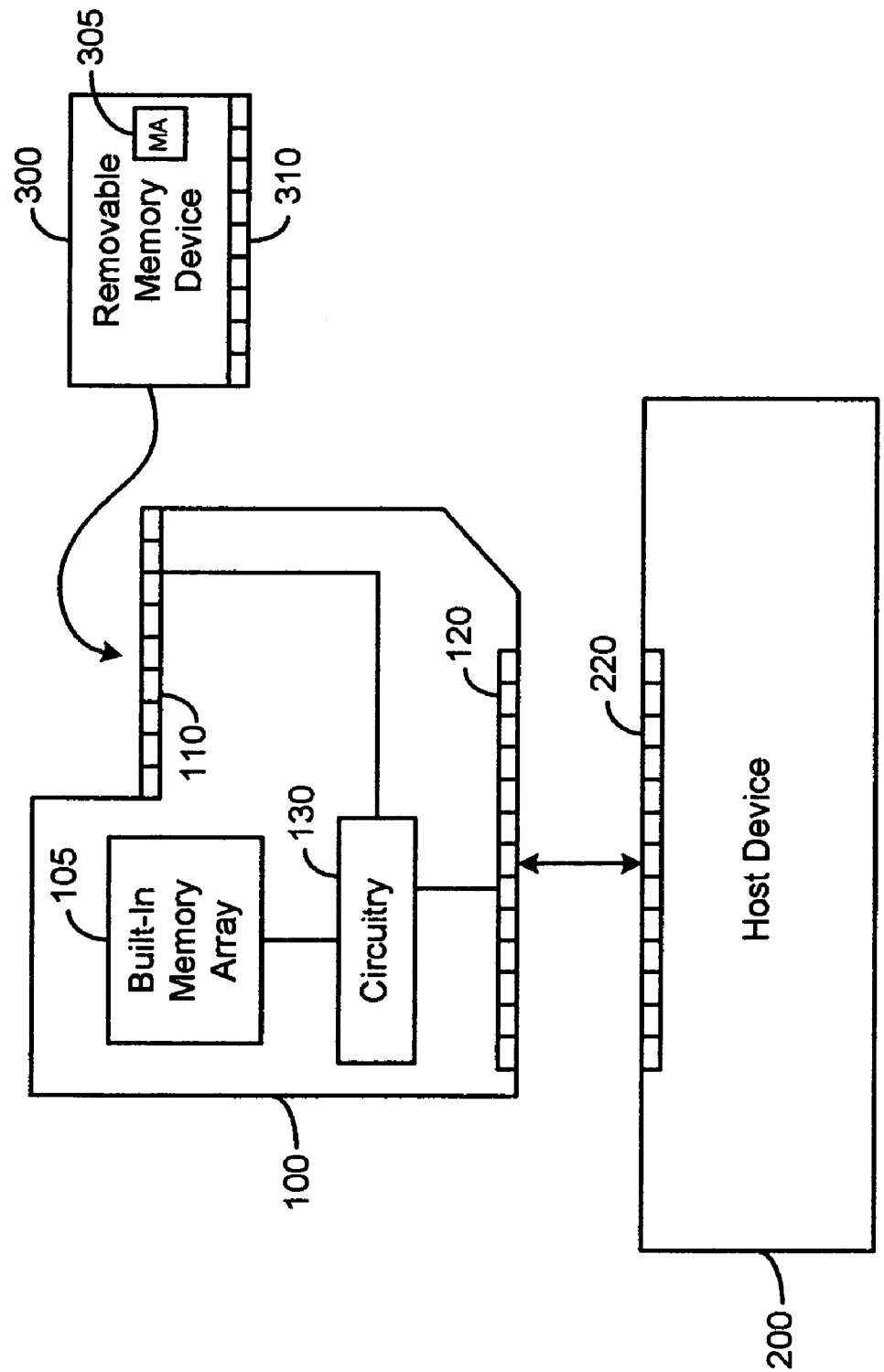
FIG. 1 is an illustration of a memory device of an embodiment connected with a host device.

Turning now to the drawings, FIG. 1 is an illustration of a memory device 100 of an embodiment connected with a host device 200 (not shown to scale). The host device 200 is a device that can read data from and/or write data to a memory device. Examples of a host device include, but are not limited to, a personal computer (PC), a notebook computer, a hand-held computer, a handheld email/text message device, a hand-held game console, a digital media (e.g., MP3) player, a cell phone, a video player (e.g., a DVD player or a portable video player), an audio and/or video recorder, a digital camera, a set-top box, a display device (e.g., a television), a printer, a car stereo, and a navigation system. Also, a host device can contain mixed functionality. For example, a host device can be a cell phone that, in addition to being able to make and receive telephone calls, is also able to play digital media (e.g., music and/or video) files. Data can include, but is not limited to, digital media content, such as an audio file or a video file (with or without audio), an image, a game, a book, a map, a data file, or a software program. The memory device 100 can take any suitable form, such as a memory card or stick. Also, as used herein, the phrases "connected with (or to)" and "coupled with (or to)" are used interchangeably and mean directly connected/coupled with/to or indirectly connected/coupled with/to through one or more components, which may or may not be shown or described herein.

As shown in FIG. 1, the memory device 100 comprises a built-in memory array 105, a first connector 110 configured to connect to a removable memory device 300, a second connector 120 configured to connect to a mating connector 220 on the host device 200, and circuitry 130. The built-in memory array 105 can take any suitable form, and, in one embodiment, is a flash memory array. It should be noted that, instead of flash, other types of non-volatile solid-state memories can be used. In this embodiment, the built-in memory array 105 is a rewritable memory array; however, in other embodiments, lower endurance (e.g., few-time programmable or one-time programmable) memory arrays can be used. The term "built-in" refers to the fact that the memory array 105 is not intended to be removed by the end-user of the memory device 100. As such, the built-in memory array 105 can be located within a housing of the memory device 100 in such a way as to make it not easily accessible by the user (e.g., the user would need to open or destroy the housing to gain physical access to the memory array 105). In contrast to the built-in memory array 105, the removable memory device 300 (connected to the first connector 110 of the memory device 100 via mating connectors 310) is intended to be removable by the end-user of the memory device 100 and, as such, is easily physically accessible to the end user. Preferably, the built-in memory array 105 has a storage capacity sufficient to store data sent by the host device 200 for storage on the memory device 100. As such, the built-in memory array 105 preferably has a greater storage capacity than a local memory used to store firmware or other small amounts of data for use by a processor on a conventional memory card adapter.

The memory device 100 also comprises circuitry 130. The circuitry 130 can be designed to perform any suitable function. In this embodiment, the circuitry 130 is operative to control read/write operations to the built-in memory array 105. As such, the circuitry 130 controls a write operation to store data, sent by the host device 200, in the built-in memory array 105, and controls a read operation to read data from the built-in memory array 105 and return it to the host device 200. Other possible and alternative functions of the circuitry 130 are described below. It should be noted that "circuitry" can include one or more components and be a pure hardware implementation and/or a combined hardware/software (or firmware) implementation. Accordingly, "circuitry" can take the form of one or more of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example.

In this embodiment, the non-volatile, solid-state memory array in the removable memory device 300 comprises a lower-endurance memory array 305 than the built-in memory array 105. ("Endurance" refers to how many times a memory cell in a memory array can be reliably programmed. Storing multiple bits per memory cell is one reason why a memory array may be lower endurance.) For example, if the built-in memory array 105 is a rewritable memory array (i.e., a memory array with memory cells capable of a very high number of rewrites), the lower-endurance memory array 305 can be a few-time programmable memory array or a one-time programmable memory array. (A few-time programmable memory array can be written into more than once but not as many times as a rewritable memory array.) As another example, if the built-in memory array 105 is a few-time programmable memory array, the lower-endurance memory array 305 can be a one-time programmable memory array (i.e., a memory array with memory cells that, once programmed, cannot be reprogrammed). For purposes of illustration, the following example will assume that the built-in memory array 105 is a rewritable memory array and that the lower-endurance memory array 305 in the removable memory device 300 is a few-time or one-time programmable memory array.

When the removable memory device 300 is connected to the memory device 100, the memory device 100 becomes a "hybrid" memory device since it has different endurance memory arrays: the relatively higher-endurance built-in memory array 105 and the relatively lower-endurance memory array 305 of the removable memory device 300. There are many advantages of using a hybrid memory device. For example, because lower-endurance memory arrays are typically less expensive than higher-endurance memory arrays, a hybrid memory device can be less expensive than a memory device that uses higher-endurance memory arrays to provide the same storage capacity. However, given the limited number of writes that can be performed to lower-endurance memory arrays, the lower-endurance memory array 305 needs to be judiciously used. For example, it may be preferred to write data that will frequently be updated in the rewritable built-in memory array 105 and to write archive data, which is not likely to change, in the lower-endurance memory array 305. U.S. patent application Ser. Nos. 11/529,555 and 11/529,582 provide more information and techniques for using a hybrid memory device with rewritable and one-time programmable memory arrays. Both of those applications are assigned to the assignee of the present application and are hereby incorporated by reference.

As lower-endurance memory cells are written into, they reduce the overall available storage capacity of the memory device 100 (either because a programmed one-time programmable memory cell cannot be reprogrammed or because a few-time programmable memory cell loses some or all of its number of re-writes). Further, even with judicious use of the lower-endurance memory array 305, over time, the lower-endurance memory array 305 may become full or lose its limited re-write ability. When this happens, the lower-endurance memory array 305 effectively become a read-only memory array. If the lower-endurance memory array 305 were also built-in to the memory device 100, the overall value of the memory device 100 to the end user would be reduced, since only the rewritable built-in memory array 105 would be available for write operations. However, because the lower-endurance memory array 305 is part of a removable memory device 300, the removable memory device 300 can be replaced with another removable memory device to provide the memory device 100 with additional storage capacity. By allowing the end user to extend the storage capacity of the hybrid memory device 100 in this way, the end user avoids the expense of buying a new hybrid memory device.

The removable memory device 300 can take any size. For example, the size of the removable memory device 300 can be the same small-form-factor size as currently available off-the-shelf memory devices, such as, but not limited to, a microSD™ card from SanDisk Corporation. Such memory devices typically include a rewritable memory array and a memory controller to control read/write operations to the rewritable memory array. Because the memory array is rewritable, the memory controller is typically integral to the function of the memory device and fully utilized throughout its life. The utilization of the memory controller is heavily weighted to writing of data since reading of data is a relatively processor-light operation. However, when the memory array is a lower-endurance memory array, the full capacity and usefulness of the memory controller in the removable memory device will become redundant early in the lifetime of the removable memory device. For example, when a one-time programmable memory array loses all of its write capacity, the need for the write capability in the memory controller becomes redundant. As such, the cost of the memory controller in the removable memory device detracts from the value gained by using a lower-endurance memory array in the removable memory device. To reduce costs, in this embodiment, the removable memory device 300 is designed without a memory controller. (In other embodiments, a removable memory device has both a lower-endurance memory array and a memory controller to control read/write operations to the lower-endurance memory array.) Because the removable memory device 300 does not have a memory controller, in this embodiment, the circuitry 120 is also operative to control read/write operations to the lower-endurance memory array 305.

If the removable memory device 300 is sized like other small-form-factor memory devices with memory controllers, the memory device 100 can contain additional functionality to enable it to also be used as an adapter for such devices. Adapters for small-form-factor memory devices with memory controllers (such as microSD™ cards from SanDisk Corporation) are available to allow such memory devices to be used with host devices having a full-size SD™ memory card slot. However, such adapters do not contain a built-in memory array and the circuitry for storing host data as described above. Equipping the memory device 100 with adapter functionality adds value to the memory device 100, as it can be used both as a hybrid memory device as well as an adapter.

Figure 2:
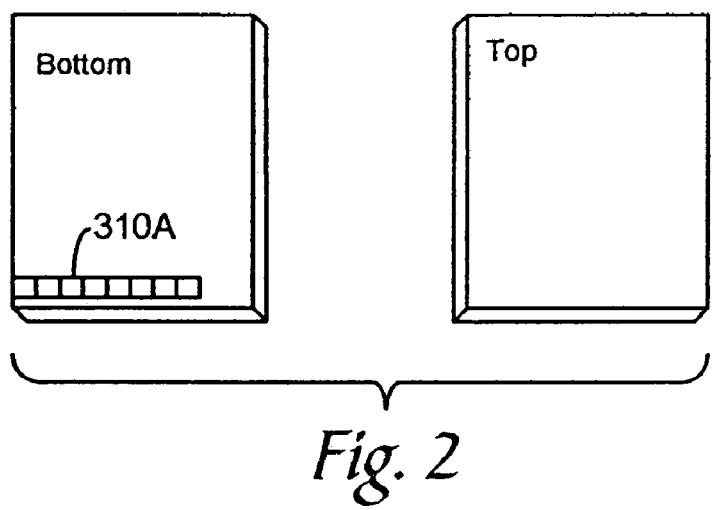
FIG. 2 is an illustration of an embodiment of top and bottom sides of a removable memory device with a memory controller.
Figure 3:
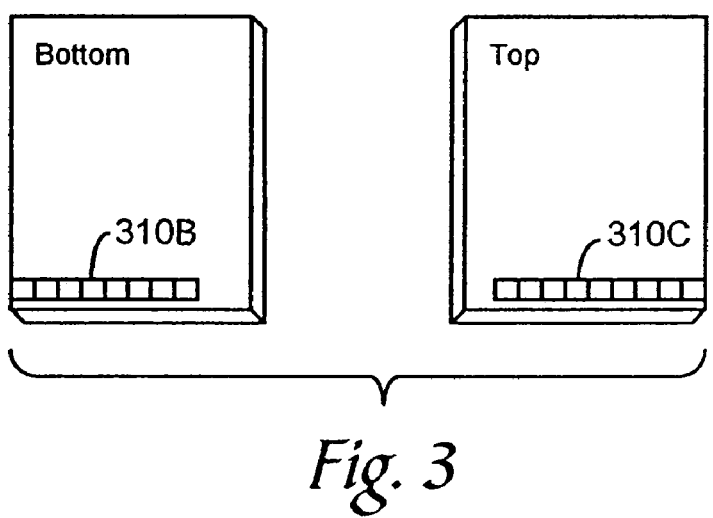
FIG. 3 is an illustration of an embodiment of top and bottom sides of a removable memory device without a memory controller.
Figure 4:
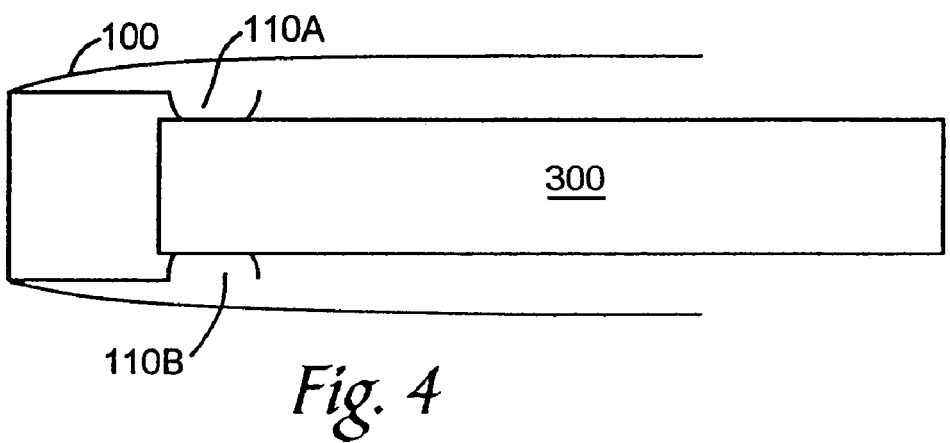
FIG. 4 is an illustration of a removable memory device connected with a memory device of an embodiment.

It should be noted that a removable memory device without a memory controller will likely have a larger pin-out than a removable memory device with a memory controller. For example, in this embodiment, a removable memory device with a memory controller has exposed electrical connectors 310A on only one side (here, the bottom—see FIG. 2), whereas a removable memory device without a memory controller has exposed electrical connectors 310B, 310C on two sides (here, the bottom and top—see FIG. 3). In order to ensure that the same physical interface of the memory device 100 can be used despite the larger pin-out of a removable memory device without a memory controller, in this embodiment, the memory device 100 has electrical connectors 110A, 110B that can mate with exposed electrical connectors on either the bottom or the top and bottom of a removable memory device (see FIG. 4). Of course, other designs can be used. For example, instead of placing exposed electrical connectors on both sides of the removable memory device, exposed electrical connectors can be placed on a single side of the removable memory device, where removable memory devices without a memory controller would have more exposed electrical connectors than removable memory devices with a memory controller. In such a situation, when a removable memory device with a memory controller is connected to the memory device, there would be "extra" exposed electrical connectors in the memory device that would not make electrical contact with the removable memory device.

Figure 5B:
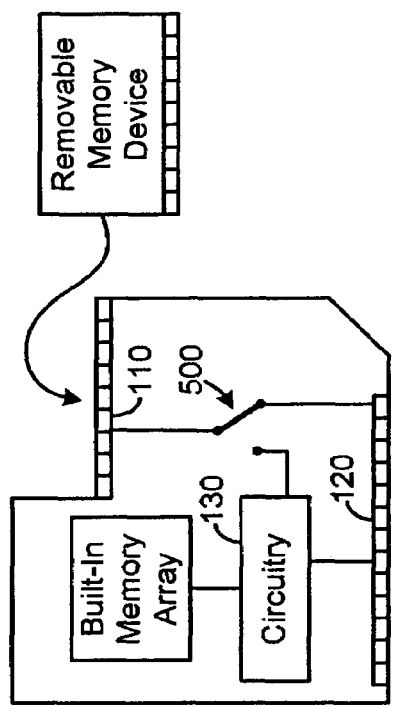
FIG. 5B is an illustration of a memory device of an embodiment with a switch positioned to connect a removable memory device to a host device by by-passing circuitry of the memory device.
Figure 5A:
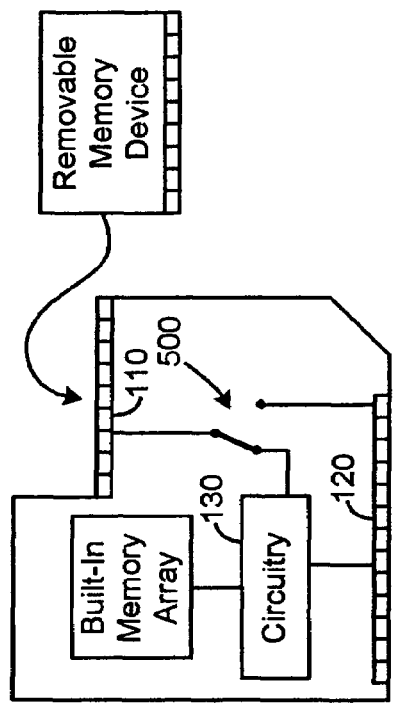
FIG. 5A is an illustration of a memory device of an embodiment with a switch positioned to connect a removable memory device to circuitry of the memory device.

In the mixed hybrid-adapter application, the circuitry 130 is preferably operative to determine whether or not the connected removable memory device has a memory controller. If the removable memory device does not have a memory controller, the circuitry 130 can control read/write operations to the removable memory device's memory array. On the other hand, if the removable memory device has its own memory controller, the circuitry's 130 read/write control can be bypassed. The circuitry 130 can make this determination in any suitable way. For example, as shown in FIGS. 5A and 5B, the memory device 100 can comprise a switch 500 that is connected to the first and second connectors 110, 120. The circuitry 130 can send a signal, through the switch 500, to an electrical pad of the first connector 110 that is only connected when the removable memory device does not have a memory controller (e.g., one of the pads on the connector 310C on the top of the removable memory device (see FIG. 3)). If the circuitry 130 detects a connection, the circuitry 130 positions the switch 500 to connect the first connector 110 to the circuitry 130, so that the circuitry 130 could control read/write operations to the removable memory device's memory array (see FIG. 5A). If the circuitry 130 does not detect a connection, the circuitry 130 positions the switch 500 to connect the first connector 110 to the second connector 120, so the host device 300 communicates directly with the removable memory device, thereby bypassing the circuitry 130 and its read/write control (see FIG. 5B).

Figure 6A:
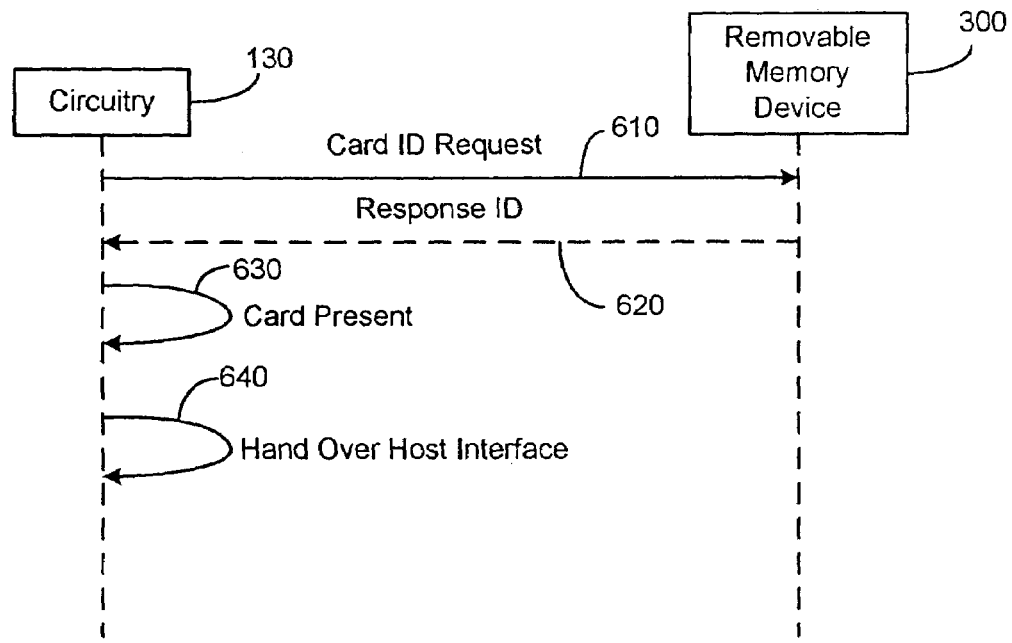
FIG. 6A is an illustration of how circuitry in a memory device of an embodiment determines that a removable memory device has a memory controller.
Figure 6B:
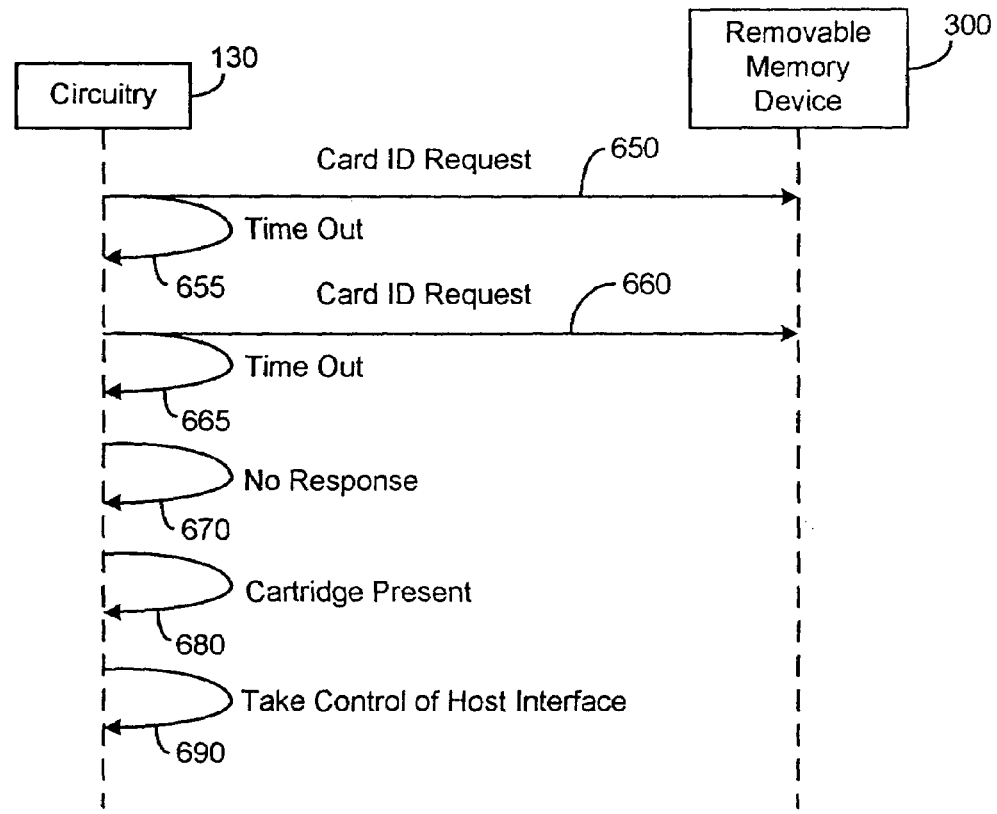
FIG. 6B is an illustration of how circuitry in a memory device of an embodiment determines that a removable memory device does not have a memory controller.

Another example of how the circuitry 130 can make the determination of removable memory device type is shown in FIGS. 6A and 6B. In these figures, a removable memory device with a controller is called a "card," and a removable memory device without a controller is called a "cartridge." In this example, the circuitry 130 makes this determination by sending a request for information to the removable memory device 300 when the memory device 100 is powered-up or when the removable memory device 300 is inserted into the memory device 100. As shown in FIG. 6A, the circuitry 130 sends a Card ID Request to the removable memory device 300 and waits for a response (act 610). If the removable memory device 300 has a memory controller, it will send a Response ID to the circuitry 130 (act 620). The circuitry 130 then determines that a card is present (act 630) and hands over host interface control to the memory controller in the removable memory device 300 (act 640). FIG. 6B illustrates what happens when the removable memory device 300 does not have a memory controller. As in FIG. 6A, the circuitry 130 sends a Card ID Request to the removable memory device 300 (act 650). Since the removable memory device 300 does not have a controller, no response is sent to this request, and the circuitry 130 times out (act 655). To ensure that the lack of a response was not an error, the circuitry 130 again sends a Card ID Request to the removable memory device 300 (act 660). Again, the circuitry 130 times out (act 665). After these two time outs 655, 665, the circuitry 130 determines that there is no response (act 670) and, accordingly, that a memory cartridge (not card) is present (act 680). The circuitry 130 then takes control of the host interface to control the read/write operations to the memory array 305 of the removable memory device (act 690).

In one embodiment, the memory device 100 takes the form similar to a current SD™ memory card product but has a replaceable memory cartridge in a form similar to that of a microSD™ card. In this way, the memory device is the combination of a current memory card based on NAND flash and a removable cartridge containing a piece of memory without a controller. Also, a current SD™-to-microSD™ card adapter can be altered to add built-in flash memory and circuitry to add full SD™ card functionality with no host-to-card interface changes. As noted above, in order for the memory cartridge to share the same form factor as a microSD™ card, the memory cartridge preferably shares the physical interface of a microSD™ card and uses a multiplexer to convert the large pin out from a memory interface to the greatly reduced pin out of an SD™ interface. When an actual microSD™ card is connected to the memory device, the memory device preferably becomes a passive pass-through, allowing the host device 200 to directly access the microSD™ card and bypassing the memory device's own electrical and physical interface.

As noted above, one of the uses of a hybrid memory device is to allow a user to back-up or archive data stored in the rewritable built-in memory array 105 to the lower-endurance memory array 305 in the removable memory device 300. In this archive operation, the circuitry 130 can archive both the data and its associated data structures or just the data (and not its associated data structures). The choice regarding whether or not to store associated data structures can be made by the host device 200, the circuitry 130, or the end-user, for example. Before turning to these operations, a brief overview of data structures will be presented.

In a NAND flash memory array, the granularity of an erase operation is much greater than the granularity of a write operation by the host device 300 (i.e., a physical block is the smallest erasable entity, whereas the host device 300 may want to re-write a smaller amount of data). To preserve the longevity and capacity of the flash memory, data is copied, consolidated, and moved into manageable and uniform units. After this operation, the original data can be deleted in order to free up space on the memory array without the risk of losing the data. This process is done safely via the use of data (or control) structures. (The terms "data structures" and "control structures" will be used interchangeably herein.) Data structures keep track of data and allow its restoration in the event of power loss or other catastrophic events. A data structure consists of indexes and cross-references to physical addresses of data in the memory array 105. Examples of data structures include, but are not limited to, boot sectors, bit-map sectors, and "chaotic block" indices. Each time data is written, erased, or moved in the memory array 105, the data structures are updated. This mechanism is completely transparent to the end user and host device 300.

Figure 7:
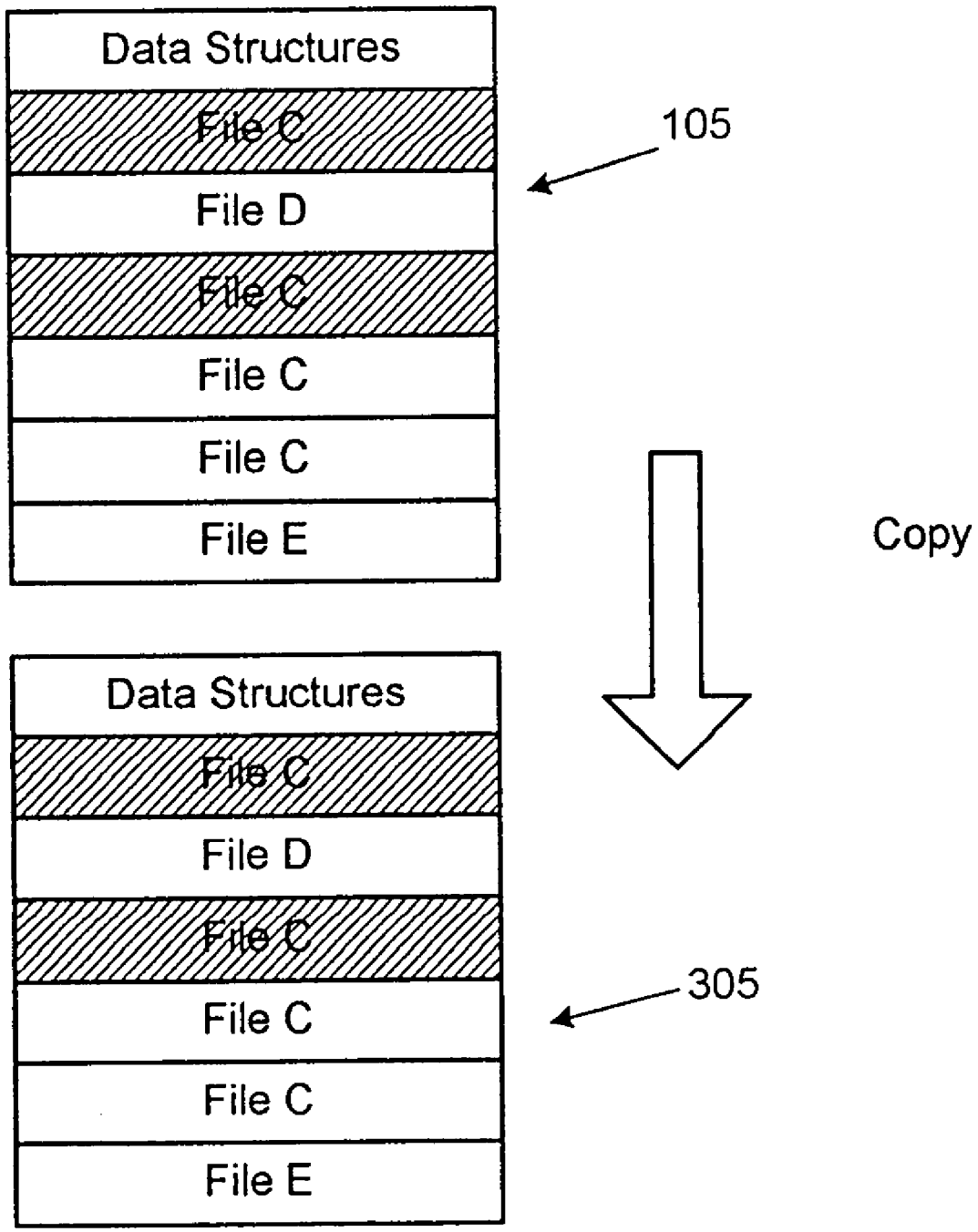
FIG. 7 is an illustration of an archive operation of an embodiment in which both data and its associated data structures are achieved in a memory array of a removable memory device.

Consider, for example, the situation in which a document file is saved in the built-in memory array 105 and is now being edited. Because of the erase nature of flash memory, the data in the file cannot simply be extracted, changed, and inserted back into its original position, as can be done on a rotating disk. Instead, the changed data will be appended to the block of the file and marked with the position of the data it replaces (see FIG. 7). This data will remain in this state until a consolidation, at which time it would replace the original data. Until that time, the data is considered "chaotic data," and a "chaotic block" index, which provides guidance as to where to store different pieces of a file in the memory array 105, is part of the data structure for that data As mentioned above, during an archive operation, the circuitry 130 can archive both the data and its associated data structures. This is shown in FIG. 7. When the removable memory device 300 is inserted into the memory device 100, the circuitry 130 would interrogate the removable memory device 300 to detect whether or not data structures are present. If data structures are detected, the circuitry 130 would use the data structures to manage the data in the removable memory device 300. In such a situation, the circuitry 130 preferably ignores any data structures in the built-in memory array 105 for the data and uses the data structures in the removable memory device 300.

Figure 8:
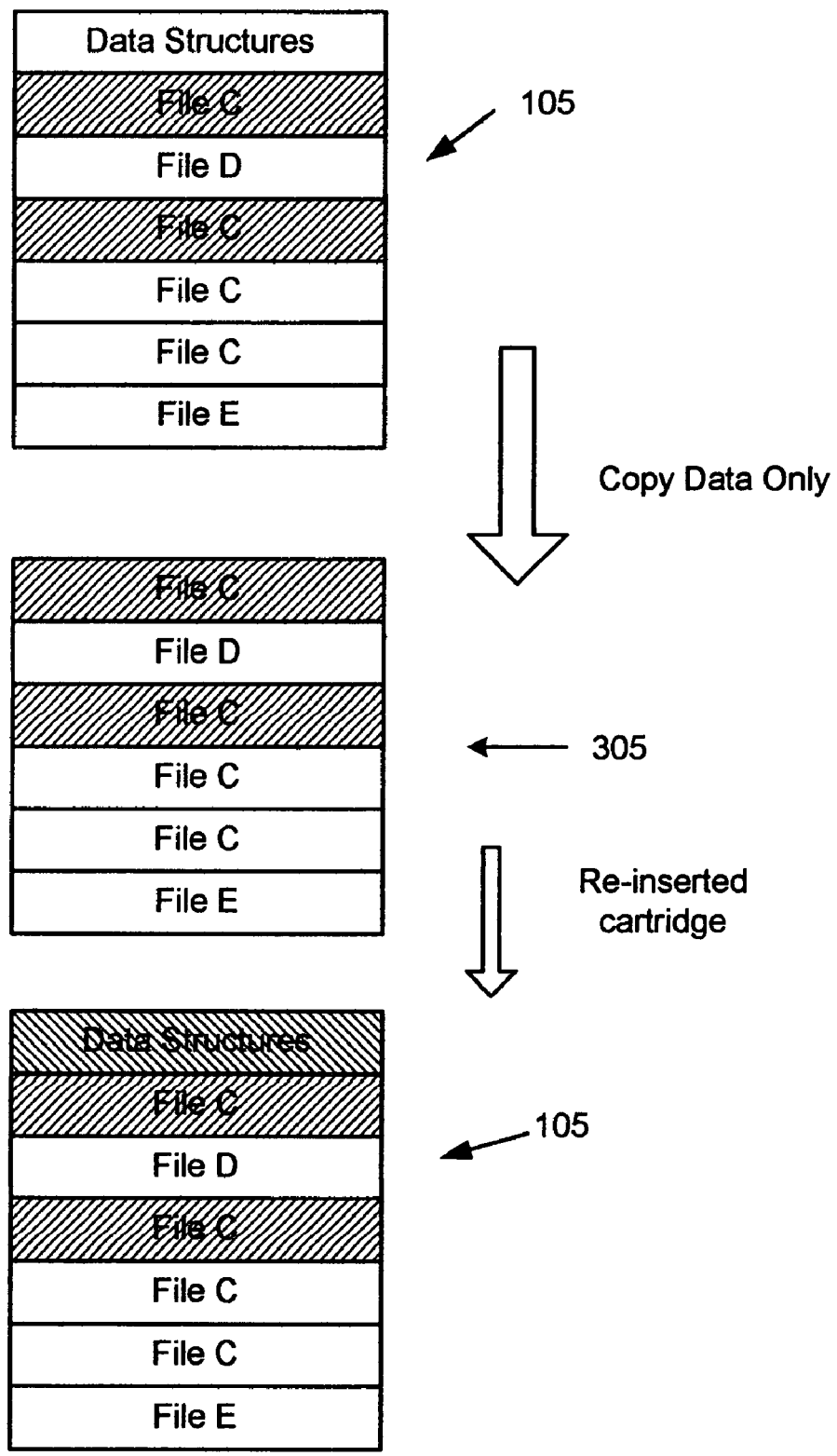
FIG. 8 is an illustration of an archive operation of an embodiment in which data is achieved in a memory array of a removable memory device without its associated data structures.

Alternatively, the circuitry 130 can archive the data without its associated data structures (see FIG. 8). As shown in FIG. 8, when the removable memory device 300 is removed from the memory device 100 and re-inserted into the memory device 100 (or inserted into a different memory device), after the circuitry 130 does not detect data structures, the circuitry 130 will build data structures from the data (e.g., from indexing information stored with the data). Data structures can be constructed from existing data on the removable memory device 300 by scanning the data, categorizing it, and recording its position. (Alternatively, the circuitry 130 can try to match the data in the removable memory device 300 with the data structure in the built-in memory 105.) This would create a "chaotic block" index and provide the circuitry 130 with a starting point onto which any updates, writes, and erases can be added to create a history.

Figure 9:
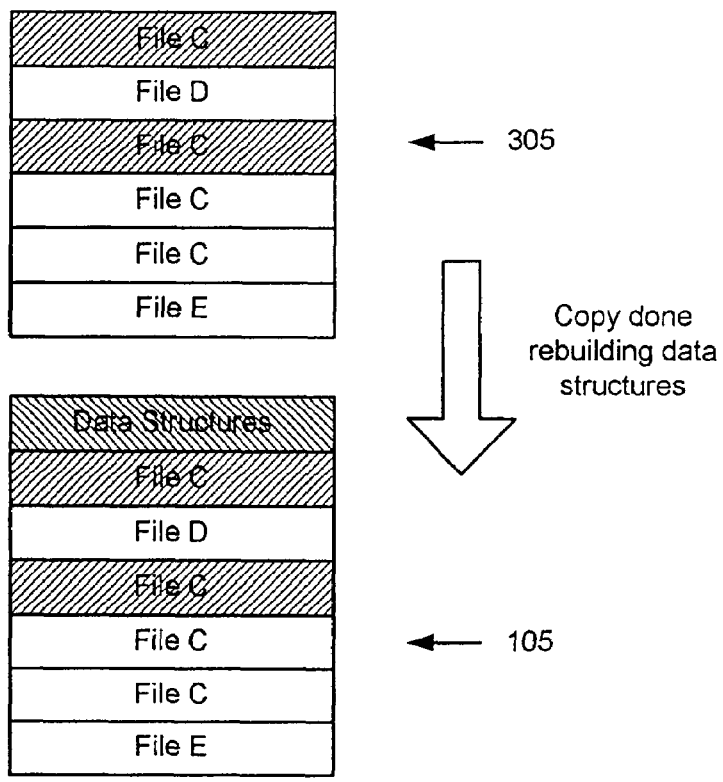
FIG. 9 is an illustration of an embodiment for transferring pre-loaded content on a removable memory device to another memory device.

While the above examples dealt with the situation in which data is placed on the removable memory device 300 via an archive operation of data previously-stored in the built-in memory 105, data can be placed on the removable memory device 300 by another entity. For example, as shown in FIG. 9, the data on the removable memory device 300 can be pre-loaded content (e.g., loaded by the manufacturer of the removable memory device, loaded by the end user from another device, etc.) that is to be loaded to the built-in memory array 105. As in the above example, the circuitry 130 could build the data structures from the pre-loaded content, if the data structures were not stored with the content. Also, pre-loaded content, such as music, video, or GPS maps, for example, can be accessed directly from the removable memory device 300 instead of first copying the pre-loaded content to the built-in memory array 105.

Figure 10:
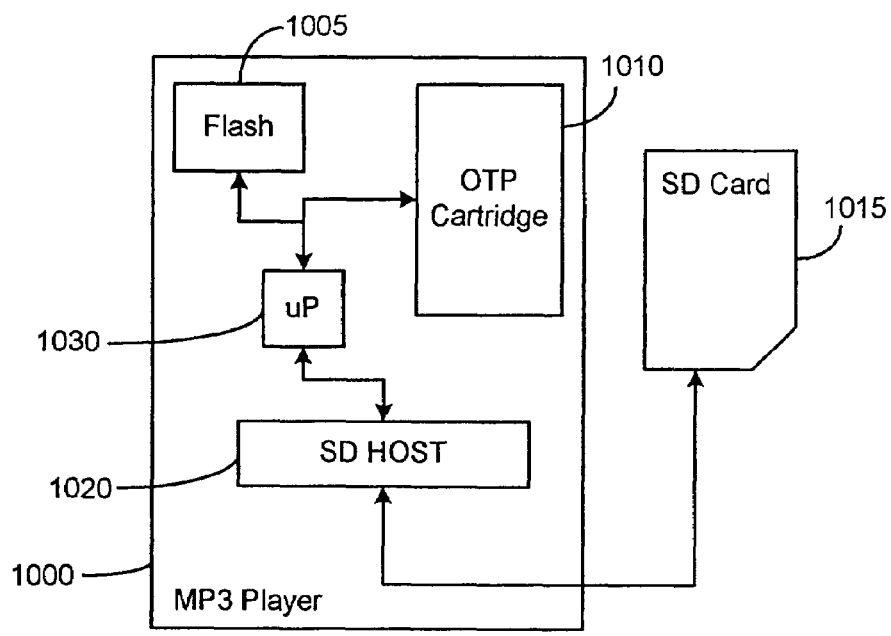
FIG. 10 is an illustration of an embodiment in which a removable memory device is used in a host device, such as an MP3 player.

Turning again to the drawings, FIG. 10 is an illustration of an embodiment in which the removable memory device is used in a host device, such as an MP3 player 1000 or other media system. Like some current MP3 players, this MP3 player 1000 has a built-in memory (here, flash memory) 1005, a slot for an SD™ card 1015, an SD™ host component 1020, and circuitry (here, a microprocessor) 1030. The SD™ host component 1020 allows the microprocessor 1030 to communicate with the SD™ card 1015 using the same protocols as when communicating with the flash memory 1005. Unlike current MP3 players, this MP3 player 1000 has a second slot for a removable memory device, such as an OTP cartridge 1010. As in the above embodiments, the OTP cartridge 1010 can be used to archive data stored in the flash memory 1005 or deliver pre-loaded content to the MP3 player 1000.

There are many alternatives that can be used with these embodiments. For example, instead of having a built-in memory array and a single connector for one removable memory device, the memory device can have a plurality of connectors for a plurality of memory devices. Also, the built-in memory of the memory device can be altered so it too is removable and replaceable by a memory of the same (e.g., rewritable) or different (e.g., lower endurance) type. As another example, while the removable memory device in the above embodiments had a lower endurance than the built-in memory array, the memory array in the removable memory device can be the same type as the built-in memory array (e.g., both rewritable). Additionally, instead of being lower endurance, the memory array in the removable memory device can be lower performance (i.e., the write and/or read operations to the memory array in the removable memory device are slower than the write and/or read operations to the built-in memory array). Further, it should be noted that the removable memory device can be a rewritable memory array with or without a memory controller, or a lower-endurance (or performance) memory array with or without a memory controller. Different endurance/performance memories are described in "Method Combining Lower-Endurance/Performance and Higher-Endurance/Performance Information Storage to Support Data Processing," U.S. patent application Ser. No. 11/731,531 and "Apparatus Combining Lower-Endurance/Performance and Higher-Endurance/Performance Information Storage to Support Data Processing," U.S. patent application Ser. No. 11/731,552, both of which are being filed herewith and are hereby incorporated by reference. As yet another alternative, instead of taking the form of a SD™ card, as in some of the above embodiments, the memory device can take the form of a USB drive, a memory stick, or any other format.

Some of the following claims may state that a component is operative to perform a certain function or configured for a certain task. It should be noted that these are not restrictive limitations. For example, circuitry recited to be operative to control read/write operations to the removable memory device's memory array can be, but does not necessarily have to be, operative to also control read/write operations to the built-in memory array. Likewise, a connector recited to be configured to connect to a certain component (e.g., a removable memory device without a memory controller) can be, but does not necessarily have to be, also configured to connect to another component (e.g., a removable memory device with a memory controller).

It is intended that the foregoing detailed description be understood as an illustration of selected forms that the invention can take and not as a definition of the invention. It is only the following claims, including all equivalents, that are intended to define the scope of this invention. It should be noted that the acts recited in the claims can be performed in any order—not necessarily in the order in which they are recited. Finally, it should be noted that any aspect of any of the preferred embodiments described herein can be used alone or in combination with one another.

What is claimed is:

1. A method for using a memory device with a built-in memory array and a connector for a removable memory device, the method comprising:
   determining whether a removable memory device connected to a first connector of a memory device comprises a memory controller, wherein the memory device comprises a second connector configured to connect to a host device and also comprises a built-in memory array;
   if it is determined that the removable memory device does not comprise a memory controller, using circuitry in the memory device to control read/write operations to a memory array in the removable memory device; and
   if it is determined that the removable memory device does comprise a memory controller, using the memory controller to control read/write operations to the memory array in the removable memory device;
   wherein when the removable memory device does not comprise a memory controller, the memory device functions as a hybrid memory device to transfer data between the built-in memory array in the memory device and the memory array in the removable memory device, and wherein when the removable memory device comprises a memory controller, the memory device functions as an adapter for the removable memory device with the memory device acting as a passive pass-through between the host device and the removable memory device.

2. The method of claim 1, wherein determining whether the removable memory device comprises a memory controller is performed by sending a request for information to the removable memory device.

3. The method of claim 2, wherein the request is sent when the memory device is powered-up.

4. The method of claim 2, wherein the request is sent when the removable memory device is connected to the first connector.

5. The method of claim 1, wherein the built-in memory array comprises a rewritable memory array, and wherein the memory array in the removable memory device is lower endurance than the built-in memory array.

6. The method of claim 5, wherein the memory array in the removable memory device comprises a few-time programmable memory array.

7. The method of claim 5, wherein the memory array in the removable memory device comprises a one-time programmable memory array.

8. The method of claim 1, wherein the memory array in the removable memory device is lower performance than the built-in memory array.

9. The method of claim 1, wherein the built-in memory array and the memory array in the removable memory device both comprise rewritable memory arrays.

10. The method of claim 1 further comprising: reading pre-loaded content from the memory array in the removable memory device; and storing the read pre-loaded content in the built-in memory array of the memory device.

11. The method of claim 10 further comprising reading associated data structures from the memory array in the removable memory device and storing them in the built-in memory array of the memory device.

12. The method of claim 10, wherein the pre-loaded content is stored in the built-in memory array of the memory device without associated data structures, and wherein the method further comprises constructing data structures from the pre-loaded content.

13. The method of claim 10, wherein the built-in memory array comprises a rewritable memory array, and wherein the memory array in the removable memory device is lower endurance than the built-in memory array.

14. The method of claim 13, wherein the memory array in the removable memory device comprises a few-time programmable memory array.

15. The method of claim 13, wherein the memory array in the removable memory device comprises a one-time programmable memory array.

16. The method of claim 10, wherein the memory array in the removable memory device is lower performance than the built-in memory array.

17. The method of claim 10, wherein the built-in memory array and the memory array in the removable memory device both comprise rewritable memory arrays.

* * * * *